United States Patent
Yoshida et al.

(10) Patent No.: US 8,623,753 B1
(45) Date of Patent: Jan. 7, 2014

(54) STACKABLE PROTRUDING VIA PACKAGE AND METHOD

(75) Inventors: Akito Yoshida, Chandler, AZ (US); Mahmoud Dreiza, Phoenix, AZ (US); Curtis Michael Zwenger, Chandler, AZ (US)

(73) Assignee: Amkor Technology, Inc.

( * ) Notice: Subject to any disclaimer, the term of this patent is extended or adjusted under 35 U.S.C. 154(b) by 1194 days.

(21) Appl. No.: 12/474,009

(22) Filed: May 28, 2009

(51) Int. Cl.
*H01L 21/44* (2006.01)

(52) U.S. Cl.
USPC ........... 438/613; 438/612; 257/686; 257/690; 257/779

(58) Field of Classification Search
USPC ................... 257/686, 690, 711, 779
See application file for complete search history.

(56) References Cited

U.S. PATENT DOCUMENTS

| | | |
|---|---|---|
| 3,868,724 A | 2/1975 | Perrino |
| 3,916,434 A | 10/1975 | Garboushian |
| 4,322,778 A | 3/1982 | Barbour et al. |
| 4,532,419 A | 7/1985 | Takeda |
| 4,642,160 A | 2/1987 | Burgess |
| 4,645,552 A | 2/1987 | Vitriol et al. |
| 4,685,033 A | 8/1987 | Inoue |
| 4,706,167 A | 11/1987 | Sullivan |
| 4,716,049 A | 12/1987 | Patraw |
| 4,786,952 A | 11/1988 | MacIver et al. |
| 4,806,188 A | 2/1989 | Rellick |
| 4,811,082 A | 3/1989 | Jacobs et al. |
| 4,897,338 A | 1/1990 | Spicciati et al. |
| 4,905,124 A | 2/1990 | Banjo et al. |
| 4,964,212 A | 10/1990 | Deroux-Dauphin et al. |
| 4,974,120 A | 11/1990 | Kodai et al. |
| 4,996,391 A | 2/1991 | Schmidt |
| 5,021,047 A | 6/1991 | Movern |

(Continued)

FOREIGN PATENT DOCUMENTS

| | | |
|---|---|---|
| JP | 05-109975 | 4/1993 |
| JP | 05-136323 | 6/1993 |

(Continued)

OTHER PUBLICATIONS

IBM Technical Disclosure Bulletin, "Microstructure Solder Mask by Means of a Laser", vol. 36, Issue 11, p. 589, Nov. 1, 1993. (NN9311589).

(Continued)

*Primary Examiner* — Marcos D. Pizarro
*Assistant Examiner* — Tifney L. Skyles
(74) *Attorney, Agent, or Firm* — McAndrews, Held & Malloy, Ltd.

(57) ABSTRACT

A method of forming a stackable protruding via package including enclosing an electronic component and electrically conductive first traces on a first surface of a substrate in a package body. Protruding via apertures are formed through the package body to expose the first traces. The protruding via apertures are filled with solder to form electrically conductive vias in direct physical and electrical contact with the first traces. Via extension bumps are attached to first surfaces of the vias. The vias and the via extension bumps are reflowed to form protruding vias. The protruding vias extend from the first traces through the package body and protrude above a principal surface of the package body. The protruding vias enable electrical connection of the stackable protruding via package to a larger substrate such as a printed circuit motherboard. Further, the protruding vias in accordance with one embodiment are formed with a minimum pitch.

21 Claims, 11 Drawing Sheets

(56) References Cited

U.S. PATENT DOCUMENTS

| | | |
|---|---|---|
| 5,072,075 A | 12/1991 | Lee et al. |
| 5,072,520 A | 12/1991 | Nelson |
| 5,081,520 A | 1/1992 | Yoshii et al. |
| 5,091,769 A | 2/1992 | Eichelberger |
| 5,108,553 A | 4/1992 | Foster et al. |
| 5,110,664 A | 5/1992 | Nakanishi et al. |
| 5,191,174 A | 3/1993 | Chang et al. |
| 5,229,550 A | 7/1993 | Bindra et al. |
| 5,239,448 A | 8/1993 | Perkins et al. |
| 5,247,429 A | 9/1993 | Iwase et al. |
| 5,250,843 A | 10/1993 | Eichelberger |
| 5,278,726 A | 1/1994 | Bernardoni et al. |
| 5,283,459 A | 2/1994 | Hirano et al. |
| 5,353,498 A | 10/1994 | Fillion et al. |
| 5,371,654 A | 12/1994 | Beaman et al. |
| 5,379,191 A | 1/1995 | Carey et al. |
| 5,404,044 A | 4/1995 | Booth et al. |
| 5,463,253 A | 10/1995 | Waki et al. |
| 5,474,957 A | 12/1995 | Urushima |
| 5,474,958 A | 12/1995 | Djennas et al. |
| 5,497,033 A | 3/1996 | Fillion et al. |
| 5,508,938 A | 4/1996 | Wheeler |
| 5,530,288 A | 6/1996 | Stone |
| 5,531,020 A | 7/1996 | Durand et al. |
| 5,546,654 A | 8/1996 | Wojnarowski et al. |
| 5,574,309 A | 11/1996 | Papapietro et al. |
| 5,581,498 A | 12/1996 | Ludwig et al. |
| 5,582,858 A | 12/1996 | Adamopoulos et al. |
| 5,616,422 A | 4/1997 | Ballard et al. |
| 5,637,832 A | 6/1997 | Danner |
| 5,674,785 A | 10/1997 | Akram et al. |
| 5,719,749 A | 2/1998 | Stopperan |
| 5,726,493 A | 3/1998 | Yamashita et al. |
| 5,739,581 A | 4/1998 | Chillara |
| 5,739,585 A | 4/1998 | Akram et al. |
| 5,739,588 A | 4/1998 | Ishida et al. |
| 5,742,479 A | 4/1998 | Asakura |
| 5,774,340 A | 6/1998 | Chang et al. |
| 5,784,259 A | 7/1998 | Asakura |
| 5,798,014 A | 8/1998 | Weber |
| 5,822,190 A | 10/1998 | Iwasaki |
| 5,826,330 A | 10/1998 | Isoda et al. |
| 5,835,355 A | 11/1998 | Dordi |
| 5,847,453 A | 12/1998 | Uematsu et al. |
| 5,883,425 A | 3/1999 | Kobayashi |
| 5,894,108 A | 4/1999 | Mostafazadeh et al. |
| 5,903,052 A | 5/1999 | Chen et al. |
| 5,907,477 A | 5/1999 | Tuttle et al. |
| 5,936,843 A | 8/1999 | Ohshima et al. |
| 5,952,611 A | 9/1999 | Eng et al. |
| 6,004,619 A | 12/1999 | Dippon et al. |
| 6,013,948 A | 1/2000 | Akram et al. |
| 6,021,564 A | 2/2000 | Hanson |
| 6,028,364 A | 2/2000 | Ogino et al. |
| 6,034,427 A | 3/2000 | Lan et al. |
| 6,035,527 A | 3/2000 | Tamm |
| 6,040,622 A | 3/2000 | Wallace |
| 6,060,778 A | 5/2000 | Jeong et al. |
| 6,069,407 A | 5/2000 | Hamzehdoost |
| 6,072,243 A | 6/2000 | Nakanishi |
| 6,081,036 A | 6/2000 | Hirano et al. |
| 6,119,338 A | 9/2000 | Wang et al. |
| 6,122,171 A | 9/2000 | Akram et al. |
| 6,127,833 A | 10/2000 | Wu et al. |
| 6,160,705 A | 12/2000 | Stearns et al. |
| 6,172,419 B1 | 1/2001 | Kinsman |
| 6,175,087 B1 | 1/2001 | Keesler et al. |
| 6,184,463 B1 | 2/2001 | Panchou et al. |
| 6,194,250 B1 | 2/2001 | Melton et al. |
| 6,204,453 B1 | 3/2001 | Fallon et al. |
| 6,214,641 B1 | 4/2001 | Akram |
| 6,235,554 B1 | 5/2001 | Akram et al. |
| 6,239,485 B1 | 5/2001 | Peters et al. |
| D445,096 S | 7/2001 | Wallace |
| D446,525 S | 8/2001 | Okamoto et al. |
| 6,274,821 B1 | 8/2001 | Echigo et al. |
| 6,280,641 B1 | 8/2001 | Gaku et al. |
| 6,316,285 B1 | 11/2001 | Jiang et al. |
| 6,351,031 B1 | 2/2002 | Iijima et al. |
| 6,353,999 B1 | 3/2002 | Cheng |
| 6,365,975 B1 | 4/2002 | DiStefano et al. |
| 6,376,906 B1 | 4/2002 | Asai et al. |
| 6,392,160 B1 | 5/2002 | Andry et al. |
| 6,395,578 B1 | 5/2002 | Shin et al. |
| 6,405,431 B1 | 6/2002 | Shin et al. |
| 6,406,942 B2 | 6/2002 | Honda |
| 6,407,341 B1 | 6/2002 | Anstrom et al. |
| 6,407,930 B1 | 6/2002 | Hsu |
| 6,448,510 B1 | 9/2002 | Neftin et al. |
| 6,451,509 B2 | 9/2002 | Keesler et al. |
| 6,479,762 B2 | 11/2002 | Kusaka |
| 6,497,943 B1 | 12/2002 | Jimarez et al. |
| 6,517,995 B1 | 2/2003 | Jacobson et al. |
| 6,534,391 B1 | 3/2003 | Huemoeller et al. |
| 6,544,638 B2 | 4/2003 | Fischer et al. |
| 6,586,682 B2 | 7/2003 | Strandberg |
| 6,608,757 B1 | 8/2003 | Bhatt et al. |
| 6,660,559 B1 | 12/2003 | Huemoeller et al. |
| 6,715,204 B1 | 4/2004 | Tsukada et al. |
| 6,727,645 B2 | 4/2004 | Tsujimura et al. |
| 6,730,857 B2 | 5/2004 | Konrad et al. |
| 6,734,542 B2 | 5/2004 | Nakatani et al. |
| 6,740,964 B2 | 5/2004 | Sasaki |
| 6,753,612 B2 | 6/2004 | Adae-Amoakoh et al. |
| 6,774,748 B1 | 8/2004 | Ito et al. |
| 6,787,443 B1 | 9/2004 | Boggs et al. |
| 6,803,528 B1 | 10/2004 | Koyanagi |
| 6,815,709 B2 | 11/2004 | Clothier et al. |
| 6,815,739 B2 | 11/2004 | Huff et al. |
| 6,838,776 B2 | 1/2005 | Leal et al. |
| 6,888,240 B2 | 5/2005 | Towle et al. |
| 6,919,514 B2 | 7/2005 | Konrad et al. |
| 6,921,968 B2 | 7/2005 | Chung |
| 6,921,975 B2 | 7/2005 | Leal et al. |
| 6,931,726 B2 | 8/2005 | Boyko et al. |
| 6,953,995 B2 | 10/2005 | Farnworth et al. |
| 7,015,075 B2 | 3/2006 | Fay et al. |
| 7,030,469 B2 | 4/2006 | Mahadevan et al. |
| 7,081,661 B2 | 7/2006 | Takehara et al. |
| 7,125,744 B2 | 10/2006 | Takehara et al. |
| 7,185,426 B1 * | 3/2007 | Hiner et al. ............ 29/841 |
| 7,198,980 B2 | 4/2007 | Jiang et al. |
| 7,242,081 B1 | 7/2007 | Lee |
| 7,282,394 B2 | 10/2007 | Cho et al. |
| 7,285,855 B2 | 10/2007 | Foong |
| 7,345,361 B2 | 3/2008 | Mallik et al. |
| 7,372,151 B1 | 5/2008 | Fan et al. |
| 7,429,786 B2 * | 9/2008 | Karnezos et al. ............ 257/686 |
| 7,459,202 B2 | 12/2008 | Magera et al. |
| 7,548,430 B1 | 6/2009 | Huemoeller et al. |
| 7,550,857 B1 | 6/2009 | Longo et al. |
| 2002/0017712 A1 | 2/2002 | Bessho et al. |
| 2002/0061642 A1 * | 5/2002 | Haji et al. ............ 438/613 |
| 2002/0066952 A1 * | 6/2002 | Taniguchi et al. ............ 257/698 |
| 2002/0195697 A1 | 12/2002 | Mess et al. |
| 2003/0025199 A1 | 2/2003 | Wu et al. |
| 2003/0128096 A1 | 7/2003 | Mazzochette |
| 2003/0141582 A1 | 7/2003 | Yang et al. |
| 2003/0197284 A1 | 10/2003 | Khiang et al. |
| 2004/0063246 A1 | 4/2004 | Karnezos |
| 2004/0145044 A1 | 7/2004 | Sugaya et al. |
| 2004/0159462 A1 | 8/2004 | Chung |
| 2005/0139985 A1 | 6/2005 | Takahashi |
| 2005/0242425 A1 | 11/2005 | Leal et al. |
| 2007/0273049 A1 | 11/2007 | Khan et al. |
| 2007/0281471 A1 | 12/2007 | Hurwitz et al. |

(56) References Cited

U.S. PATENT DOCUMENTS

2007/0290376 A1    12/2007    Zhao et al.
2008/0230887 A1    9/2008    Sun et al.

FOREIGN PATENT DOCUMENTS

| JP | 07-017175 | 1/1995 |
| JP | 08-190615 | 7/1996 |
| JP | 10-334205 | 12/1998 |

OTHER PUBLICATIONS

Kim et al., "Application of Through Mold Via (TMV) as PoP base package", 58th ECTC Proceedings, May 2008, Lake Buena Vista, FL, 6 pages, IEEE.

Scanlan, "Package-on-package (PoP) with Through-mold Vias", Advanced Packaging, Jan. 2008, 3 pages, vol. 17, Issue 1, PennWell Corporation.

Hiner et al., "Printed Wiring Motherboard Having Bonded Interconnect Redistribution Mesa", U.S. Appl. No. 10/992,371, filed Nov. 18, 2004.

Scanlan et al., "Semiconductor Package Including a Top-Surface Metal Layer for Implementing Circuit Features", U.S. Appl. No. 11/293,999, filed Dec. 5, 2005.

Hiner et al., "Semiconductor Package Including Top-Surface Terminals for Mounting Another Semiconductor Package", U.S. Appl. No. 11/595,411, filed Nov. 9, 2006.

Huemoeller et al., "Build Up Motherboard Fabrication Method and Structure", U.S. Appl. No. 11/824,395, filed Jun. 29, 2007.

Berry et al., "Thin Stacked Interposer Package", U.S. Appl. No. 11/865,617, filed Oct. 1, 2007.

Longo et al., "Stacked Redistribution Layer (RDL) Die Assembly Package", U.S. Appl. No. 12/387,672, filed May 5, 2009.

Huemoeller et al., "Buildup Dielectric Layer Having Metallization Pattern Semiconductor Package Fabrication Method", U.S. Appl. No. 12/387,691, filed May 5, 2009.

Miller, Jr. et al., "Thermal Via Heat Spreader Package and Method", U.S. Appl. No. 12/421,118, filed Apr. 9, 2009.

\* cited by examiner

STACKABLE PROTRUDING VIA PACKAGE AND METHOD

BACKGROUND OF THE INVENTION

1. Field of the Invention

The present application relates to the field of electronics, and more particularly, to methods of forming electronic component packages and related structures.

2. Description of the Related Art

To form an electronic component package, an electronic component is mounted to a substrate. The substrate includes traces on the same surface of the substrate to which the electronic component is mounted. Bond wires are formed to electrically connect bond pads of the electronic component to the traces.

To protect the electronic component as well as the bond wires, the electronic component and bond wires are covered in an encapsulant. The traces extend from under the encapsulant to an exposed area of the surface of the substrate outside of the periphery of the encapsulant, i.e., not covered by the encapsulant. The traces include terminals on the exposed area of the substrate outside of and around the encapsulant.

Solder balls are formed on the terminals. These solder balls extend from the substrate to a height greater than the height of the encapsulant to allow the solder balls to be electrically connected to a larger substrate such as a printed circuit motherboard.

However, the solder balls are substantially spherical in shape. Thus, forming the solder balls with a height greater than the height of the encapsulant places fundamental restrictions on minimizing the pitch of the solder balls.

SUMMARY OF THE INVENTION

In accordance with one embodiment, a method of forming an electronic component assembly includes forming a stackable protruding via package including enclosing an electronic component and electrically conductive first traces on a first surface of a substrate in a package body, e.g., an encapsulant. Protruding via apertures are formed through the package body to expose the first traces, e.g., terminals thereof. The protruding via apertures are filled with solder to form electrically conductive vias in direct physical and electrical contact with the first traces. Via extension bumps are attached to first surfaces of the vias. The vias and the via extension bumps are reflowed to form protruding vias. The protruding vias extend from the first traces through the package body and protrude above a principal surface of the package body.

The protruding vias enable electrical connection of the stackable protruding via package to a larger substrate such as a printed circuit motherboard. Further, the protruding vias in accordance with one embodiment are formed with a minimum pitch.

In one embodiment, the method further includes stacking a second package on the stackable protruding via package. By stacking the second package on the stackable protruding via package, the occupied area on the larger substrate is minimized as compared to mounting the second package and the stackable protruding via package to the larger substrate in a side by side arrangement.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
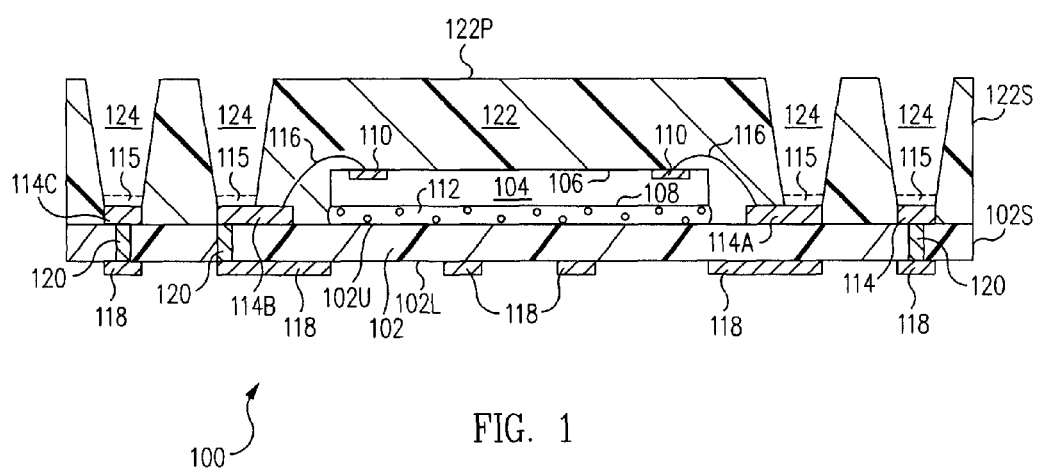
FIG. 1 is a cross-sectional view of a stackable protruding via package during fabrication in accordance with one embodiment.

As an overview, referring to FIG. 1, a method of forming a stackable protruding via package 100 including enclosing an electronic component 104 and upper traces 114 (which include upper traces 114A, 114B, 114C) on an upper surface 102U of a substrate 102 in a package body 122. Protruding via apertures 124 are formed through package body 122 to expose upper traces 114, e.g., terminals thereof.

Figure 2:
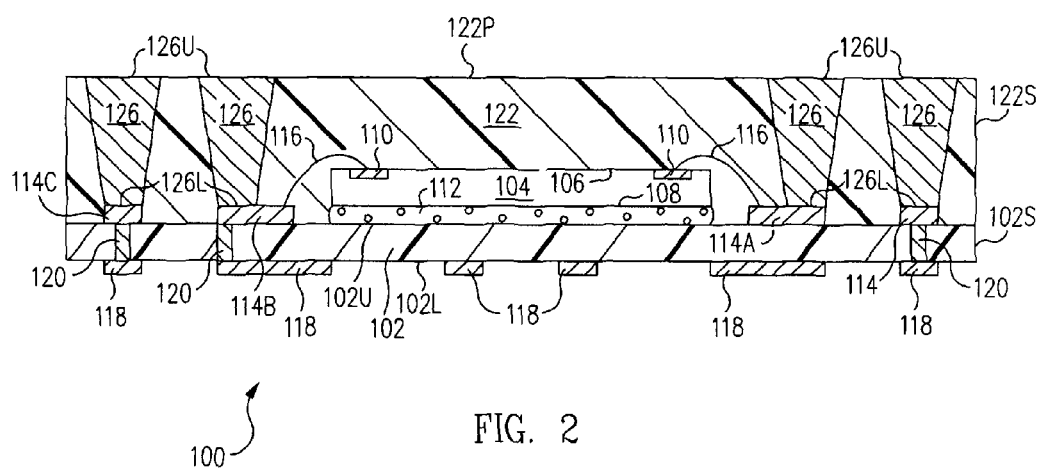
FIGS. 2, 3, and 4 are cross-sectional views of the stackable protruding via package of FIG. 1 at later stages during fabrication in accordance with various embodiments.
Figure 3:
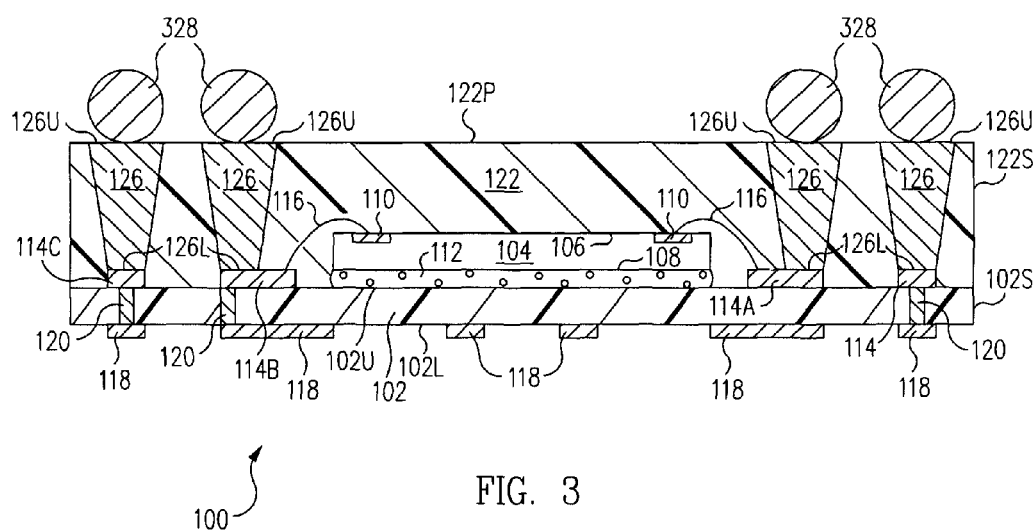

Referring now to FIGS. 1 and 2 together, protruding via apertures 124 are filled with solder to form vias 126 in direct physical and electrical contact with upper traces 114. Referring now to FIG. 3, via extension bumps 328 are attached to vias 126. Vias 126 and via extension bumps 328 are reflowed to form protruding vias 430 as illustrated in FIG. 4.

Figure 4:
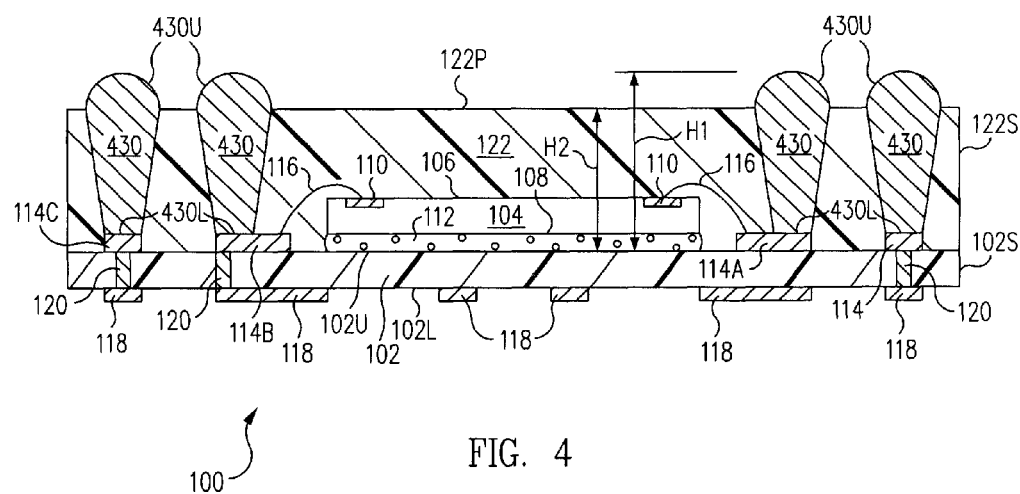
Figure 5:
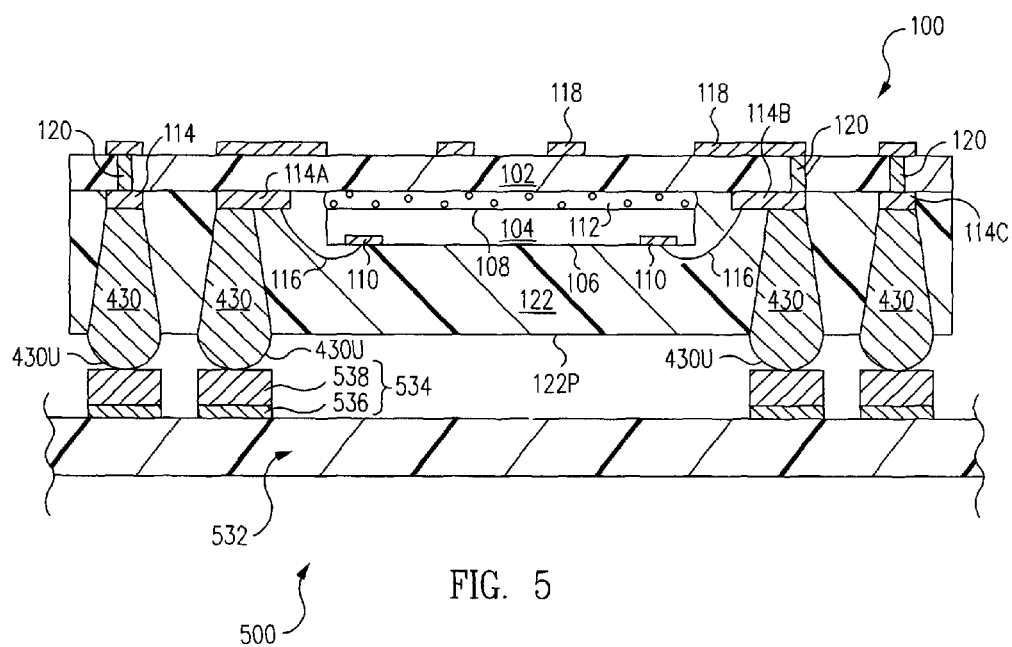
FIG. 5 is a cross-sectional view of an electronic component assembly including the stackable protruding via package of FIG. 4 during fabrication in accordance with one embodiment.

Referring now to FIG. 4, protruding vias 430 extend from upper traces 114 through package body 122 and protrude above a principal surface 122P of package body 122. Referring now to FIG. 5, protruding vias 430 enable electrical connection of stackable protruding via package 100 to a larger substrate 532 such as a printed circuit motherboard. Further, protruding vias 430 in accordance with one embodiment are formed with a minimum pitch. In various embodiments, referring now to FIG. 9, one or more second packages 901 are stacked on stackable protruding via package 100.

Now in more detail, FIG. 1 is a cross-sectional view of a stackable protruding via package 100 during fabrication in accordance with one embodiment. Stackable protruding via package 100, sometimes called an electronic component package, includes a substrate 102 including an upper, e.g., first, surface 102U and an opposite lower, e.g., second, surface 102L. Substrate 102 further includes sides 102S extending perpendicularly between upper surface 102U and lower surface 102L. Substrate 102 is a dielectric material such as laminate, ceramic, printed circuit board material, or other dielectric material.

Stackable protruding via package 100 further includes an electronic component 104. In one embodiment, electronic component 104 is an integrated circuit chip, e.g., an active component. However, in other embodiments, electronic component 104 is a passive component such as a capacitor, resistor, or inductor.

In accordance with this embodiment, electronic component 104 includes an active surface 106 and an opposite inactive surface 108. Electronic component 104 further includes bond pads 110 formed on active surface 106. Inactive surface 108 is mounted to upper surface 102U of substrate 102 with an adhesive 112, sometimes called a die attach adhesive.

Formed on upper surface 102U of substrate 102 are electrically conductive upper, e.g., first, traces 114, e.g., formed of copper. Bond pads 110 are electrically connected to upper traces 114, e.g., bond fingers thereof, by electrically conductive bond wires 116.

Formed on lower surface 102L of substrate 102 are lower, e.g., second, traces 118. Lower traces 118 are electrically connected to upper traces 114 by electrically conductive vias 120 extending through substrate 102 between upper surface 102U and lower surface 102L. Although not illustrated in FIG. 1, in one embodiment, stackable protruding via package 100 further includes solder masks on upper and lower surface 102U, 102L that protect first portions of upper and lower traces 114, 118 while exposing second portions, e.g., terminals and/or bond fingers, of upper and lower traces 114, 118.

Although a particular electrically conductive pathway between bond pads 110 and lower traces 118 is described above, other electrically conductive pathways can be formed. For example, contact metallizations can be formed between the various electrical conductors.

Further, instead of straight though vias 120, in one embodiment, substrate 102 is a multilayer substrate and a plurality of vias and/or internal traces form the electrical interconnection between upper traces 114 and lower traces 118.

In accordance with one embodiment, one or more of upper traces 114 is not electrically connected to a lower traces 118, i.e., is electrically isolated from lower traces 118, and electrically connected to bond pads 110. To illustrate, a first upper trace 114A of the plurality of upper traces 114 is electrically isolated from lower traces 118 and electrically connected to a respective bond pad 110. In accordance with this embodiment, the respective bond pad 110 electrically connected to upper trace 114A is also electrically isolated from lower traces 118.

In accordance with one embodiment, one or more of upper traces 114 is electrically connected to both bond pads 110 and to lower traces 118. To illustrate, a second upper trace 114B of the plurality of upper traces 114 is electrically connected to a respective bond pad 110 and to one or more lower traces 118. In accordance with this embodiment, the respective bond pad 110 is electrically connected to upper trace 114B and is also electrically connected to lower traces 118.

In accordance with one embodiment, one or more of upper traces 114 is not electrically connected to a bond pad 110, i.e., is electrically isolated from bond pads 110, and electrically connected to a lower trace 118. To illustrate, a third upper trace 114C of the plurality of upper traces 114 is electrically isolated from bond pads 110 and electrically connected to lower trace(s) 118. In accordance with this embodiment, the respective lower trace(s) 118 electrically connected to upper trace 114C are electrically isolated from bond pads 110.

Although various examples of connections between bond pads 110, upper traces 114, and lower traces 118 are set forth above, in light of this disclosure, those of skill in the art will understand that any one of a number of electrical configurations are possible depending upon the particular application.

Electronic component 104, bond wires 116, and the exposed portions of upper surface 102U including upper traces 114 are enclosed, sometimes called encased, encapsulated, and/or covered, with a package body 122. Illustratively, package body 122 is a cured liquid encapsulant, molding compound, or other dielectric material. Package body 122 protects electronic component 104, bond wires 116, and the exposed portions of upper surface 102U including upper traces 114 from the ambient environment, e.g., from contact, moisture and/or shorting to other structures.

Package body 122 includes a principal surface 122P parallel to upper surface 102U of substrate 102. In accordance with this embodiment, package body 122 includes sides 122S extending perpendicularly between substrate 102 and principal surface 122P. Sides 122S are parallel to and lie in the same plane as sides 102S of substrate 102. Thus, package body 122 entirely covers upper traces 114.

Illustratively, stackable protruding via package 100 is formed simultaneously with a plurality of packages in an array or strip. The array or strip is singulated resulting in sides 122S of package body 122 parallel to and lying in the same plane as sides 102S of substrate 102.

Although the terms parallel, perpendicular, and similar terms are used herein, it is to be understood that the described features may not be exactly parallel and perpendicular, but only substantially parallel and perpendicular to within excepted manufacturing tolerances.

Stackable protruding via package 100 includes protruding via apertures 124 penetrating into package body 122 from principal surface 122P. In one embodiment, protruding via apertures 124 are formed using a laser-ablation process. More particularly, a laser is repeatedly directed at principal surface 122P perpendicularly to principal surface 122P. This laser ablates, i.e., removes, portions of package body 122 leaving protruding via apertures 124, sometimes called through holes.

Although a laser-ablation process for formation of protruding via apertures 124 is set forth above, in other embodiments, other via apertures formation techniques are used. For example, protruding via apertures 124 are formed using selective molding, milling, mechanical drilling, chemical etching and/or other via aperture formation techniques.

As illustrated in FIG. 1, protruding via apertures 124 extend between principal surface 122P of package body 122 and upper traces 114, e.g., terminals of upper traces 114. Accordingly, upper traces 114 are exposed through protruding via apertures 124.

Protruding via apertures 124 taper from principal surface 122P to upper traces 114. More particularly, the diameter of protruding via apertures 124 in a plane parallel to principal surface 122P is greatest at principal surface 122P and smallest at upper traces 114 and gradually diminishes between principal surface 122P and upper traces 114.

In another embodiment, protruding via apertures 124 have a uniform diameter, i.e., have a cylindrical shape. In yet another embodiment, protruding via apertures 124 taper from upper traces 114 to principal surface 122P. More particularly, the diameter of protruding via apertures 124 in a plane parallel to principal surface 122P is smallest at principal surface 122P and greatest at upper traces 114 and gradually increases between principal surface 122P and upper traces 114.

In one embodiment, upper traces 114 include solder terminals 115 (indicated by the dashed lines, sometimes called Solder-On-Pad or SOP) formed on upper traces 114 prior to the formation of protruding via apertures 124, i.e., prior to the formation of package body 122. Package body 122 as formed thus encloses solder terminals 115.

Protruding via apertures 124 are formed to expose solder terminals 115. In accordance with this embodiment, protruding via apertures 124 extend between principal surface 122P of package body 122 and solder terminals 115 on upper traces 114, e.g., on terminals of upper traces 114. Solder terminals 115, e.g., formed of solder, reflow along with vias 126 and via extension bumps 328 as illustrated in FIG. 3 to form protruding vias 430 as illustrated in FIG. 4. Although not illustrated in the subsequent figures or discussed further below, solder terminals 115 can be formed on upper traces 114 prior to the formation of protruding via apertures 124 in any of the following embodiments.

FIG. 2 is a cross-sectional view of stackable protruding via package 100 of FIG. 1 at a later stage during fabrication in accordance with one embodiment. Referring now to FIGS. 1 and 2 together, electrically conductive vias 126 are formed within protruding via apertures 124. More particularly, protruding via apertures 124 are filled with an electrically conductive material e.g., solder, plated copper, electrically conductive adhesive, to form vias 126 in direct physical and electrical contact with upper traces 114.

As illustrated in FIG. 2, vias 126 extend between principal surface 122P of package body 122 and upper traces 114. Vias 126 have upper, e.g., first, surfaces 126U and lower, e.g., second, surfaces 126L. Upper surfaces 126U are parallel to and lie in the same plane as principal surface 122P of package body 122. Lower surfaces 126L are parallel to and lie in the same plane as upper traces 114. In accordance with this embodiment, vias 126 completely fill protruding via apertures 124. However, in another embodiment, vias 126 only partially fill protruding via apertures 124 such that upper surfaces 126U are recessed below principal surface 122P.

Vias 126 extend between upper surfaces 126U and lower surfaces 126L. In accordance with this embodiment, upper surfaces 126U have a greater area than the area of lower surfaces 126L. Accordingly, vias 126 taper from upper surfaces 126U to lower surfaces 126L. More particularly, the diameter of vias 126 in a plane parallel to principal surface 122P is greatest at upper surfaces 126U and smallest at lower surfaces 126L and gradually diminish between upper surfaces 126U and lower surfaces 126L.

In another embodiment, vias 126 have a uniform diameter, i.e., have a cylindrical shape where lower surfaces 126L are equal in area to upper surfaces 126U. In yet another embodiment, vias 126 taper from lower surfaces 126L to upper surfaces 126U. More particularly, the diameter of vias 126 in a plane parallel to principal surface 122P is smallest at upper surfaces 126U and greatest at lower surface 126L and gradually increases between upper surface 126U and lower surface 126L.

FIG. 3 is a cross-sectional view of stackable protruding via package 100 of FIG. 2 at a later stage during fabrication in accordance with one embodiment. Referring now to FIG. 3, via extension bumps 328 are attached to vias 126. More particularly, via extension bumps 328 are attached to upper surfaces 126U of vias 126.

In one embodiment, via extension bumps 328 are formed of solder, e.g., are solder balls, and are attached to upper surfaces 126U of vias 126 using flux or other technique. In another embodiment, via extension bumps 328 are solder paste that is screen printed on upper surfaces 126U of vias 126.

FIG. 4 is a cross-sectional view of stackable protruding via package 100 of FIG. 3 at a later stage during fabrication in accordance with one embodiment. Referring now to FIGS. 3 and 4 together, stackable protruding via package 100 is heated and cooled to reflow via extension bumps 328 thus forming protruding vias 430.

More particularly, vias 126 and via extension bumps 328, e.g., solder, are heated to melt vias 126 and via extension bumps 328. Upon melting, vias 126 and via extension bumps 328 combine into single molten structures, e.g., molten solder. These molten structures cool and form protruding vias 430. In accordance with this embodiment, protruding vias 430 are integral, i.e., are a single unitary structure and not a plurality of different layers connected together.

Protruding vias 430 extend from upper traces 114 through package body 122 and protrude above principal surface 122P of package body 122. Protruding vias 430 completely fill protruding via apertures 124 in accordance with this embodiment.

Protruding vias 430 have exposed, e.g., first, surfaces 430U and lower, e.g., second, surfaces 430L. Exposed surfaces 430U protrude above, outward from, and beyond principal surface 122P, i.e., the plane defined thereby, of package body 122. Exposed surfaces 430U are curved and protrude outward from principal surface 122P in a convex shape. Lower surfaces 430L are parallel to and lies in the same plane as upper traces 114.

Protruding vias 430 extend between exposed surfaces 430U and lower surfaces 430L. In accordance with this embodiment, protruding vias 430 taper from exposed surfaces 430U to lower surfaces 430L. More particularly, the diameter of protruding vias 430 in a plane parallel to principal surface 122P is greatest at principal surface 122P and smallest at lower surfaces 430L and gradually diminish between principal surface 122P and lower surfaces 430L.

In another embodiment, protruding vias 430 have a uniform diameter, except for the portion of protruding vias 430 that protrude beyond principal surface 122P. In yet another embodiment, protruding vias 430 taper from lower surfaces 430L to exposed surfaces 430U. More particularly, the diameter of protruding vias 430 in a plane parallel to principal surface 122P is greatest at lower surfaces 430L and gradually decreases between lower surface 430L and principal surface 122P.

Protruding vias 430 are electrically connected to upper traces 114. As set forth above, in accordance with various embodiments, upper traces 114 are electrically connected to lower traces 118, to bond pads 110, and/or to lower traces 118 and bond pads 110. Thus, in accordance with various embodiments, at least some of protruding vias 430 are electrically connected to lower traces 118 only, to bond pads 110 only, and/or to both lower traces 118 and bond pads 110.

Protruding vias 430 extend from upper surface 102U of substrate 102 to a height H1 greater than a height H2 of principal surface 122P of package body 122 from upper surface 102U of substrate 102. This allows electrical connection of stackable protruding via package 100 to a larger substrate such as a printed circuit motherboard as discussed in greater detail below with reference to FIG. 5. Further, protruding vias 430 in accordance with one embodiment are formed with a minimum pitch, e.g., have a pitch of 0.4 millimeters (mm) or less.

As illustrated in FIG. 4, exposed surfaces 430U are exposed and are unconnected to another structure other than stackable protruding via package 100, i.e., have an absence of connections to other structures. Protruding vias 430 form means for electrically and physically connecting stackable protruding via package 100 to terminals of a larger substrate such as a printed circuit motherboard as discussed in greater detail below with reference to FIG. 5.

FIG. 5 is a cross-sectional view of an electronic component assembly 500 including stackable protruding via package 100 of FIG. 4 during fabrication in accordance with one embodiment. Referring now to FIG. 5, a larger substrate 532 such as a printed circuit motherboard includes a plurality of terminals 534 formed thereon. In accordance with the embodiment illustrated, terminals 534 are formed of electrically conductive lands 536 having electrically conductive interconnection paste 538 formed thereon. Protruding vias 430, e.g., exposed surfaces 430U, are placed in contact with terminals 534 as illustrated in FIG. 5. Assembly 500 is heated to reflow protruding vias 430 and interconnection paste 538 thereby physically and electrically connecting protruding vias 430 to terminals 534.

In another embodiment, terminals 534 are formed without interconnection paste 538. In accordance with this embodiment, assembly 500 is heated to reflow protruding vias 430 thereby physically and electrically connecting protruding vias 430 to terminals 534, which are formed by lands 536.

Figure 6:
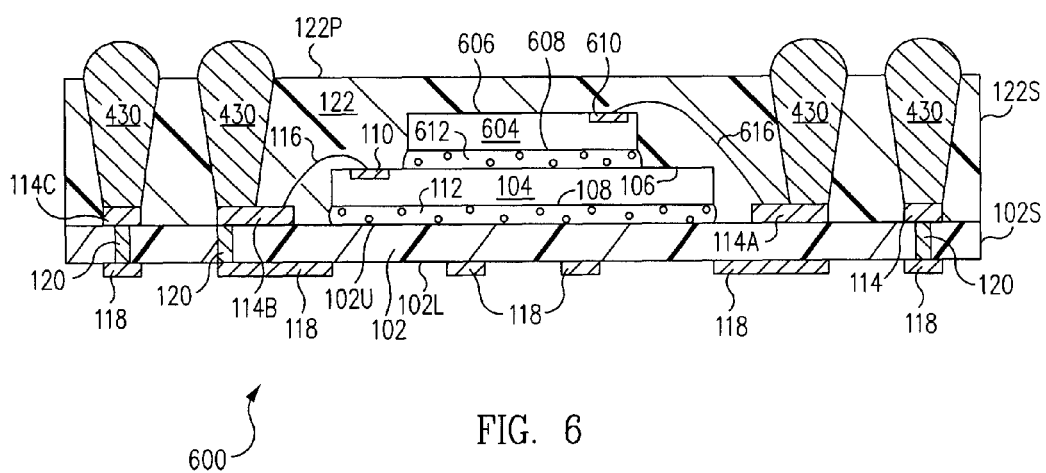
FIGS. 6, 6A, 7, and 8 are cross-sectional views of stackable protruding via packages in accordance with various embodiments.

FIG. 6 is a cross-sectional view of a stackable protruding via package 600 in accordance with another embodiment. Stackable protruding via package 600 of FIG. 6 is similar to stackable protruding via package 100 of FIG. 4 and only the significant differences between stackable protruding via package 600 and stackable protruding via package 100 are discussed below.

Referring now to FIG. 6, in accordance with this embodiment, stackable protruding via package 600 includes a second electronic component 604. Second electronic component 604 is stacked on electronic component 104, sometimes called a first electronic component.

In one embodiment, second electronic component 604 is an integrated circuit chip, e.g., an active component. However, in other embodiments, second electronic component 604 is a passive component such as a capacitor, resistor, or inductor.

In accordance with this embodiment, second electronic component 604 includes an active surface 606 and an opposite inactive surface 608. Second electronic component 604 further includes bond pads 610 formed on active surface 606. Inactive surface 608 is mounted to active surface 106 of electronic component 104 with an adhesive 612, sometimes called a die attach adhesive. Bond pads 610 are electrically connected to upper traces 114 by electrically conductive bond wires 616.

As illustrated in FIG. 6, in accordance with this embodiment, second electronic component 604 is mounted to first electronic component 104 inward of bond pads 110. Package body 122 further encloses second electronic component 604 and bond wires 616.

Figure 6A:
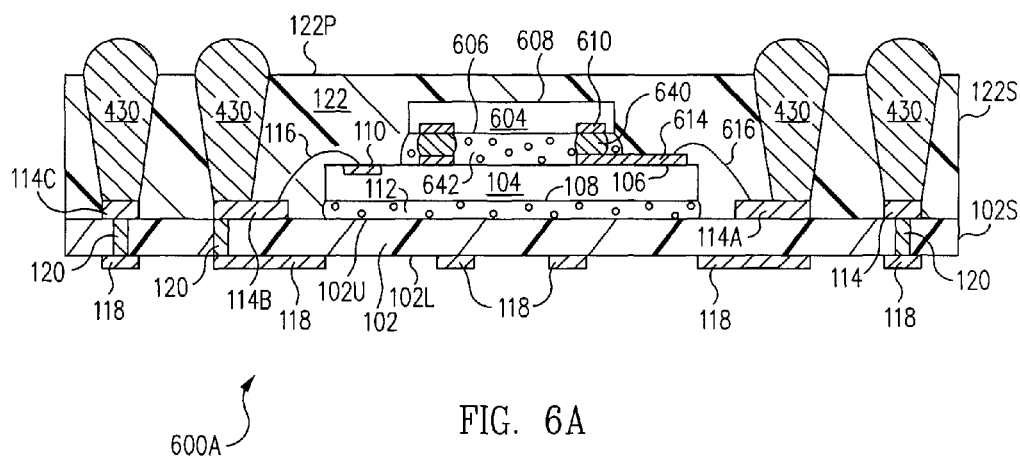

FIG. 6A is a cross-sectional view of a stackable protruding via package 600A in accordance with another embodiment. Stackable protruding via package 600A of FIG. 6A is similar to stackable protruding via package 600 of FIG. 6 and only the significant differences between stackable protruding via package 600A and stackable protruding via package 600 are discussed below.

Referring now to FIG. 6A, in accordance with this embodiment, stackable protruding via package 600A includes second electronic component 604 mounted in a flip chip configuration. More particularly, bond pads 610 are mounted to electrically conductive traces 614, sometimes called a redistribution layer, on active surface 106 of electronic component 104 by electrically conductive flip chip bumps 640, e.g., solder. Traces 614 are electrically connected to upper traces 114 by electrically conductive bond wires 616.

As also illustrated in FIG. 6A, in one embodiment, an underfill 642 is applied. Underfill 642 fills the space between active surface 106 of electronic component 104 and active surface 606 of second electronic component 604. Underfill 642 encloses and protects flip chip bumps 640. Underfill 642 is optional, and in one embodiment, is not formed.

Figure 7:
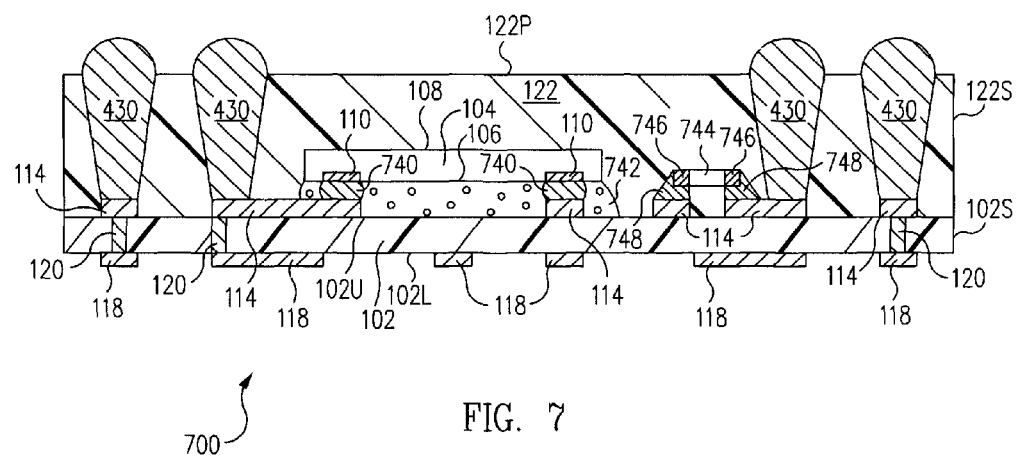

FIG. 7 is a cross-sectional view of a stackable protruding via package 700 in accordance with another embodiment. Stackable protruding via package 700 of FIG. 7 is similar to stackable protruding via package 100 of FIG. 4 and only the significant differences between stackable protruding via package 700 and stackable protruding via package 100 are discussed below.

Referring now to FIG. 7, in accordance with this embodiment, stackable protruding via package 700 includes electronic component 104 mounted in a flip chip configuration. More particularly, bond pads 110 are mounted to upper traces 114 by electrically conductive flip chip bumps 740, e.g., solder.

As also illustrated in FIG. 7, in one embodiment, an underfill 742 is applied. Underfill 742 fills the space between active surface 106 of electronic component 104 and upper surface 102U of substrate 102. Underfill 742 encloses and protects flip chip bumps 740. Underfill 742 is optional, and in one embodiment, is not formed.

Stackable protruding via package 700 further includes a passive component 744, e.g., a capacitor, resistor, or inductor. Passive component 744 includes terminals 746 mounted to upper traces 114 with solder joints 748.

Passive component 744, solder joints 748, electronic component 104, flip chip bumps 740, and underfill 742 are encloses within package body 122.

Figure 8:
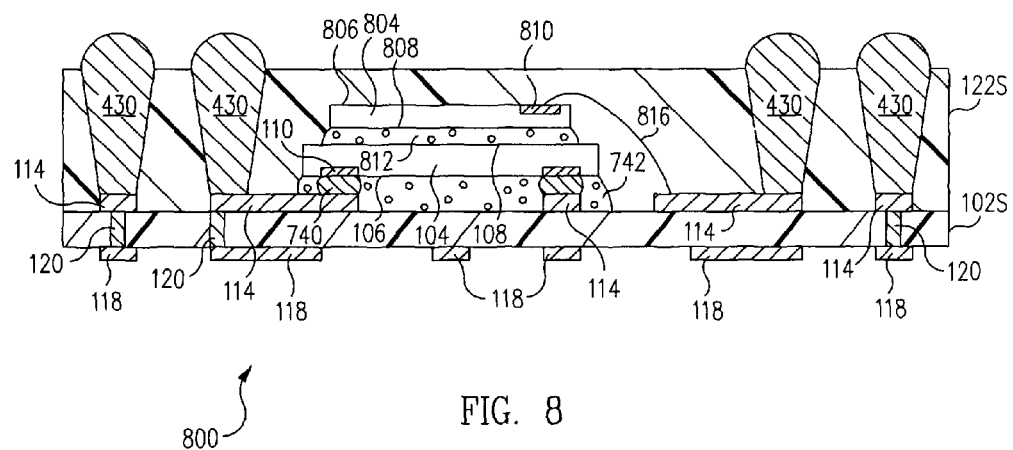

FIG. 8 is a cross-sectional view of a stackable protruding via package 800 in accordance with another embodiment. Stackable protruding via package 800 of FIG. 8 is similar to stackable protruding via package 700 of FIG. 7 and only the significant differences between stackable protruding via package 800 and stackable protruding via package 700 are discussed below.

Referring now to FIG. 8, in accordance with this embodiment, stackable protruding via package 800 includes electronic component 104 mounted in a flip chip configuration as discussed above in reference to stackable protruding via package 700 of FIG. 7. Stackable protruding via package 800 further includes a second electronic component 804. Second electronic component 804 is stacked on electronic component 104, sometimes called a first electronic component.

In one embodiment, second electronic component 804 is an integrated circuit chip, e.g., an active component. However, in other embodiments, second electronic component 804 is a passive component such as a capacitor, resistor, or inductor.

In accordance with this embodiment, second electronic component 804 includes an active surface 806 and an opposite inactive surface 808. Second electronic component 804 further includes bond pads 810 formed on active surface 806. Inactive surface 808 is mounted to inactive surface 108 of electronic component 104 with an adhesive 812, sometimes called a die attach adhesive. Bond pads 810 are electrically connected to upper traces 114 by electrically conductive bond wires 816.

Package body 122 further encloses second electronic component 804 and bond wires 816.

Figure 9:
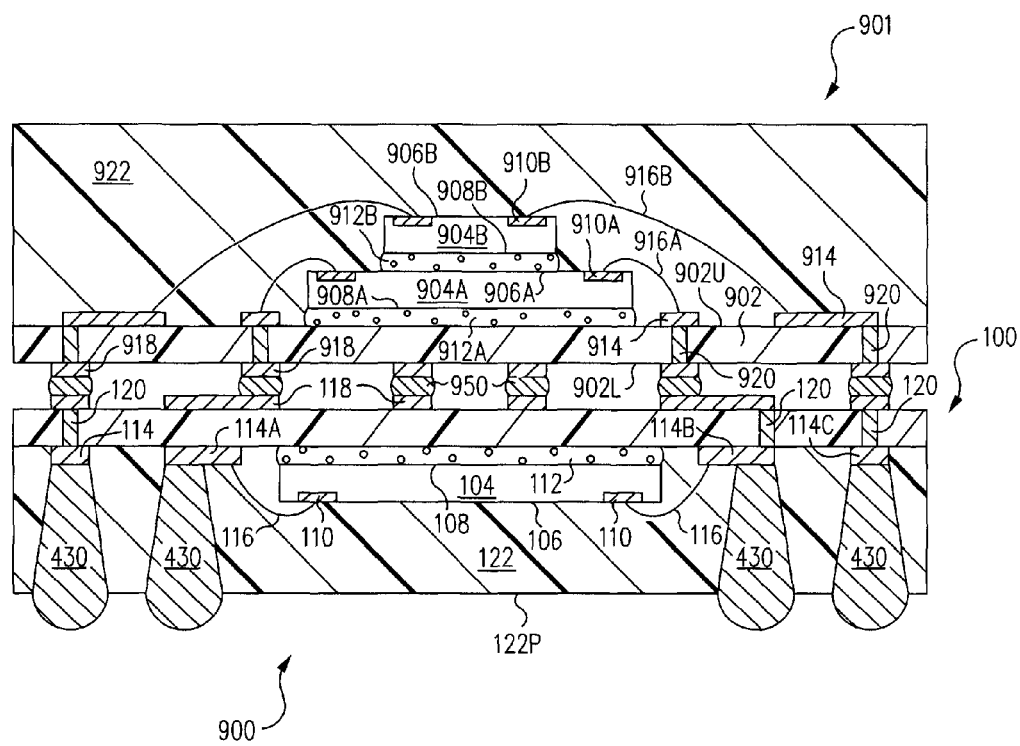
FIG. 9 is a cross-sectional view of a stacked protruding via package including the stackable protruding via package of FIG. 4 in accordance with one embodiment.

FIG. 9 is a cross-sectional view of a stacked protruding via package 900 including stackable protruding via package 100 of FIG. 4 in accordance with one embodiment. Referring now to FIG. 9, in accordance with this embodiment, stacked protruding via package 900, sometimes called an electronic component assembly, includes a second package 901 stacked on stackable protruding via package 100.

For example, second package 901 is a memory package that is stacked on stackable protruding via package 100 for use in a digital still camera application. By stacking second package 901 on stackable protruding via package 100, the area occupied by stacked protruding via package 900 on the larger substrate is minimized as compared to mounting second package 901 and stackable protruding via package 100 to the larger substrate in a side by side arrangement.

Second package 901 of FIG. 9 is similar in some respect to stackable protruding via package 600 of FIG. 6. Second package 901 includes a substrate 902 having upper and lower surfaces 902U, 902L, a first electronic component 904A having bond pads 910A on an active surface 906A, an inactive surface 908A, an adhesive 912A, bond wires 916A, upper traces 914, lower traces 918, vias 920, a second electronic component 904B having bond pads 910B on an active surface 906B, an inactive surface 908B, an adhesive 912B, bond wires 916B, and package body 922 similar to substrate 102 having upper and lower surfaces 102U, 102L, first electronic component 104 having bond pads 110 on active surface 106, inactive surface 108, adhesive 112, bond wires 116, upper traces 114, lower traces 118, vias 120, second electronic component 604 having bond pads 610 on active surface 606, inactive surface 608, adhesive 612, bond wires 616, and package body 122, respectively, and so the description thereof is not repeated for purposes of simplicity of discussion.

In accordance with this embodiment, second package 901 is mounted to stackable protruding via package 100 with interconnection balls 950, e.g., solder. In one embodiment, interconnection balls 950 are formed on lower traces 118 (which are orientated upwards in the view of FIG. 9), e.g., as a ball grid array. Interconnection balls 950 are reflowed to mount second package 901 to stackable protruding via package 100. Interconnection balls 950 extend between lower traces 118 of stackable protruding via package 100 and lower traces 918, e.g., terminals thereof, of second package 901.

As set forth above, lower traces 118 are electrically coupled to protruding vias 430, bond pads 110, and/or both protruding vias 430 and bond pads 110. Accordingly, lower traces 918, e.g., terminals thereof, are electrically connected to protruding vias 430, bond pads 110, and/or both protruding vias 430 and bond pads 110.

Although a particular second package 901 is set forth, in light of this disclosure, those of skill in the art will understand that any one of a number of electronic components and/or electronic component packages can be stacked on stackable protruding via package 100 in a similar manner. An example of another configuration of stacking of electronic components and electronic component packages on stackable protruding via package 100 is set forth below in reference to FIG. 10.

Figure 10:
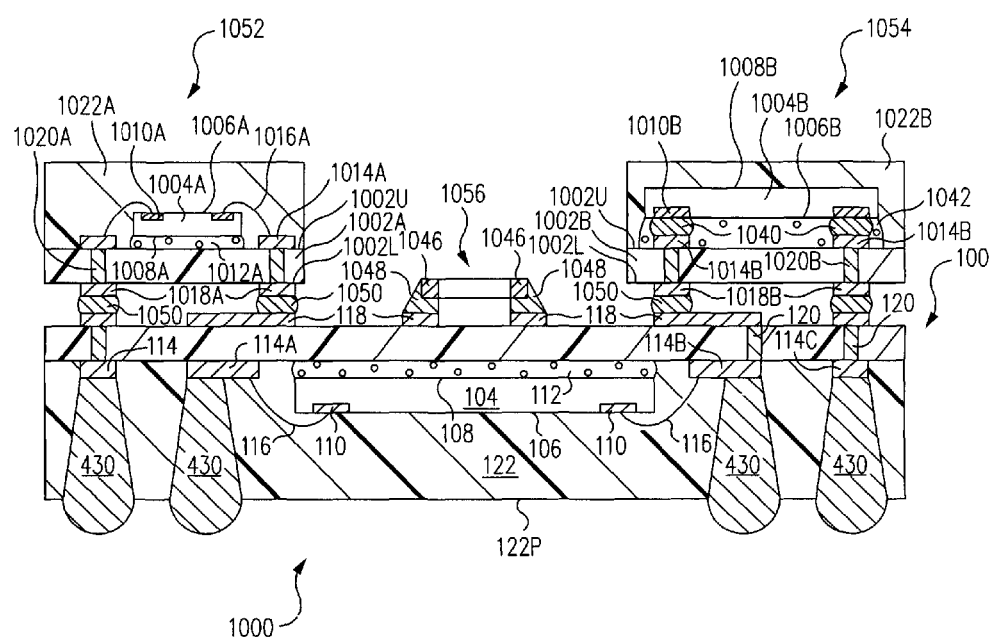
FIG. 10 is a cross-sectional view of a stacked protruding via package including the stackable protruding via package of FIG. 4 in accordance with another embodiment.

FIG. 10 is a cross-sectional view of a stacked protruding via package 1000 including stackable protruding via package 100 of FIG. 4 in accordance with another embodiment. Referring now to FIG. 10, in accordance with this embodiment, stacked protruding via package 1000 includes a second package 1052, a third package 1054, and a passive component 1056 stacked on stackable protruding via package 100.

Second package 1052 of FIG. 10 is similar in some respect to stackable protruding via package 100 of FIG. 4. Second package 1052 includes a substrate 1002A having upper and lower surfaces 1002U, 1002L, a first electronic component 1004A having bond pads 1010A on an active surface 1006A, an inactive surface 1008A, an adhesive 1012A, bond wires 1016A, upper traces 1014A, lower traces 1018A, vias 1020A, and package body 1022A similar to substrate 102 having upper and lower surfaces 102U, 102L, first electronic component 104 having bond pads 110 on active surface 106, inactive surface 108, adhesive 112, bond wires 116, upper traces 114, lower traces 118, vias 120, and package body 122, respectively, and so the description thereof is not repeated for purposes of simplicity of discussion.

In accordance with this embodiment, second package 1052 is mounted to stackable protruding via package 100 with interconnection balls 1050, e.g., solder. Interconnection balls 1050 extend between lower traces 118 (which are orientated upwards in the view of FIG. 10) of stackable protruding via package 100 and lower traces 1018A of second package 1052.

As set forth above, lower traces 118 are electrically coupled to protruding vias 430, bond pads 110, and/or both protruding vias 430 and bond pads 110. Accordingly, lower traces 1018A, e.g., terminals thereof, are electrically connected to protruding vias 430, bond pads 110, and/or both protruding vias 430 and bond pads 110.

Third package 1054 of FIG. 10 is similar in some respect to stackable protruding via package 700 of FIG. 7. Third package 1054 includes a substrate 1002B having upper and lower surfaces 1002U, 1002L, a first electronic component 1004B having bond pads 1010B on an active surface 1006B, an inactive surface 1008B, flip chip bumps 1040, optional under fill 1042, upper traces 1014B, lower traces 1018B, vias 1020B, and package body 1022B similar to substrate 102 having upper and lower surfaces 102U, 102L, first electronic component 104 having bond pads 110 on active surface 106, inactive surface 108, flip chip bumps 740, optional under fill 742, upper traces 114, lower traces 118, vias 120, and package body 122, respectively, and so the description thereof is not repeated for purposes of simplicity of discussion.

In accordance with this embodiment, third package 1054 is mounted to stackable protruding via package 100 with interconnection balls 1050, e.g., solder. Interconnection balls 1050 extend between lower traces 118 of stackable protruding via package 100 and lower traces 1018B of third package 1054.

As set forth above, lower traces 118 are electrically coupled to protruding vias 430, bond pads 110, and/or both protruding vias 430 and bond pads 110. Accordingly, lower traces 1018B, e.g., terminals thereof, are electrically connected to protruding vias 430, bond pads 110, and/or both protruding vias 430 and bond pads 110.

Passive component 1056, e.g., a capacitor, resistor, or inductor, includes terminals 1046 mounted to lower traces 118 with solder joints 1048. As set forth above, lower traces 118 are electrically coupled to protruding vias 430, bond pads 110, and/or both protruding vias 430 and bond pads 110. Accordingly, terminals 1046 of passive component 1056 are electrically connected to protruding vias 430, bond pads 110, and/or both protruding vias 430 and bond pads 110.

In stacked protruding via packages 900, 1000 of FIGS. 9, 10, additional electronic components and electronic component packages are illustrated and discussed as being stacked upon stackable protruding via package 100 of FIG. 4. However, in light of this disclosure, those of skill in the art will understand that the illustrations and discussions are equally applicable to the stacking of additional electronic components and electronic component packages on stackable protruding via packages 600, 600A, 700, 800 of FIG. 6, 6A, 7, 8, respectively.

In another embodiment, a triple stacked module, sometimes called a stacked protruding via package, is formed. For example, using two or more stackable protruding via packages similar to stackable protruding via packages 100, 600, 600A, 700, 800 of FIG. 4, 6, 6A, 7, 8, respectively, and another one or more electronic component package, three or more electronic component packages are stacked to form a triple stacked module.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method of forming an electronic component assembly comprising forming a stackable protruding via package comprising:
    enclosing an electronic component and electrically conductive first traces on a first surface of a substrate in a package body;
    subsequent to the enclosing, forming protruding via apertures through the package body to expose the first traces;
    filling the protruding via apertures with solder to form electrically conductive vias in direct physical and electrical contact with the first traces;
    attaching via extension bumps to first surfaces of the vias; and
    reflowing the vias and the via extension bumps to form protruding vias extending from the first traces through the package body and protruding above a principal surface of the package body, wherein a diameter of the protruding vias in a plane parallel to the principal surface is greatest at the principal surface.

2. The method of claim 1 wherein the forming a stackable protruding via package further comprises:
    mounting the electronic component to the first surface of the substrate.

3. The method of claim 2 wherein the mounting comprises:
    mounting an inactive surface of the electronic component to the first surface of the substrate with an adhesive.

4. The method of claim 3 wherein the forming a stackable protruding via package further comprises:
    electrically connecting bond pads on an active surface of the electronic component to the first traces with bond wires.

5. The method of claim 4 wherein the electronic component is a first electronic component, the forming a stackable protruding via package further comprising:
    mounting an inactive surface of a second electronic component to the active surface of the first electronic component with an adhesive; and
    electrically connecting bond pads on an active surface of the second electronic component to the first traces with bond wires.

6. The method of claim 2 wherein the mounting comprises:
    mounting bond pads on an active surface of the electronic component to the first traces with flip chip bumps.

7. The method of claim 6 wherein the forming a stackable protruding via package further comprises:
    applying an underfill between the active surface of the electronic component and the first surface of the substrate, the underfill enclosing the flip chip bumps.

8. The method of claim 6 wherein the forming a stackable protruding via package further comprises mounting a passive component to the first traces.

9. The method of claim 6 wherein the electronic component is a first electronic component, the forming a stackable protruding via package further comprising:
    mounting an inactive surface of a second electronic component to an inactive surface of the first electronic component with an adhesive; and
    electrically connecting bond pads on an active surface of the second electronic component to the first traces with bond wires.

10. The method of claim 1 further comprising mounting the protruding vias to terminals of a larger substrate.

11. The method of claim 10 wherein the terminals comprise:
    lands; and
    interconnection paste on the lands.

12. The method of claim 1 further comprising stacking a second package on the stackable protruding via package.

13. The method of claim 12 wherein the stackable protruding via package further comprises second traces on a second surface of the substrate, the second traces being electrically connected to the protruding vias, the stacking comprising:
    mounting terminals of the second package to the second traces of the stackable protruding via package.

14. A method of forming an electronic component assembly comprising forming a stackable protruding via package comprising:
    enclosing an electronic component and electrically conductive first traces on a first surface of a substrate in a package body; and
    forming protruding vias in direct physical and electrical contact with the first traces, the protruding vias being integral and extending from lower surfaces of the protruding vias at the first traces through the package body to exposed surfaces of the protruding vias, wherein the exposed surfaces protrude outward from a principal surface of the package body in a convex shape, wherein a diameter of the protruding vias in a plane parallel to the principal surface diminishes outward from the principal surface.

15. The method of claim 14 further comprising mounting terminals of a second package to second traces of the stackable protruding via package, the second traces being on a second surface of the substrate, the second traces being electrically connected to the protruding vias.

16. A method of forming an electronic component assembly comprising forming a stackable protruding via package comprising:
    forming solder terminals on electrically conductive first traces on a first surface of a substrate;
    enclosing an electronic component, the first traces, and the solder terminals in a package body;
    forming protruding via apertures through the package body to expose the solder terminals;
    filling the protruding via apertures with solder to form electrically conductive vias in direct physical and electrical contact with the solder terminals;
    attaching via extension bumps to first surfaces of the vias; and
    reflowing the solder terminals, the vias and the via extension bumps to form protruding vias extending from the first traces through the package body and protruding above a principal surface of the package body, wherein a diameter of the protruding vias in a plane parallel to the principal surface is greatest at the principal surface.

17. A method of forming an electronic component assembly comprising forming a stackable protruding via package comprising:
    forming a package body to enclose an electronic component and electrically conductive first traces on a first surface of a substrate;
    subsequent to the forming a package body, forming protruding via apertures extending through the package body from a principal surface of the package body to the first traces; and
    forming protruding vias completely filling the protruding via apertures, the protruding vias being integral and extending from lower surfaces of the protruding vias at the first traces through the package body to exposed surfaces of the protruding vias, wherein the exposed surfaces protrude outward from the principal surface in a convex shape, wherein a diameter of the protruding vias in a plane parallel to the principal surface diminishes outward from the principal surface.

18. The method of claim 17 wherein the protruding vias form means for electrically and physically connecting the stackable electronic component package to terminals of a larger substrate.

19. The method of claim 18 further comprising:
electrically and physically connecting the stackable electronic component package to the terminals of the larger substrate with the protruding vias.

20. The method of claim 17 further comprising:
stacking a second package on the stackable electronic component package.

21. The method of claim 17 wherein a pitch of the protruding vias is 0.4 millimeters (mm) or less.

\* \* \* \* \*